(12) United States Patent
Nakamura et al.

(10) Patent No.: US 6,960,834 B2
(45) Date of Patent: Nov. 1, 2005

(54) SEMICONDUCTOR DEVICE HAVING MULTI-LAYER INTERCONNECTION STRUCTURE AND METHOD OF MANUFACTURING THE SAME

(75) Inventors: Naofumi Nakamura, Yokohama (JP); Noriaki Matsunaga, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 6 days.

(21) Appl. No.: 10/628,372

(22) Filed: Jul. 29, 2003

(65) Prior Publication Data

US 2004/0222533 A1 Nov. 11, 2004

(30) Foreign Application Priority Data

Apr. 28, 2003 (JP) .......................... 2003-123737

(51) Int. Cl.[7] .......................... H01L 23/48; H01L 29/40
(52) U.S. Cl. .................. 257/758; 257/651; 257/752; 257/760
(58) Field of Search ................ 257/651, 752, 257/758, 760, 773, 774, E23.152, E23.145, E23.142

(56) References Cited

U.S. PATENT DOCUMENTS 5,994,777 A * 11/1999 Farrar ...................... 257/758
5,998,293 A * 12/1999 Dawson et al. .............. 438/619
6,017,814 A * 1/2000 Grill et al. .................. 438/619
6,211,561 B1 * 4/2001 Zhao .......................... 257/522
6,291,891 B1 9/2001 Higashi et al.
6,566,244 B1 * 5/2003 May et al. ................... 438/622

OTHER PUBLICATIONS

Kelly H. Block, et al., "Integration of CMP with Low-k Materials". Semiconductor International, Jun. 2002, pp. 115–122.

* cited by examiner

*Primary Examiner*—Tom Thomas
*Assistant Examiner*—Matthew E. Warren
(74) *Attorney, Agent, or Firm*—Oblon, Spivak, McClelland, Maier & Neustadt, P.C.

(57) ABSTRACT

A semiconductor device includes a foundation having a first conductive region, and an inter-connection layer provided separate from the foundation. A first region occupying a range from the foundation to the interconnection layer is filled with gas or provided with a first interlayer dielectric film. A first connection plug provided in the first region electrically connects the first conductive region and the interconnection layer. A dielectric first support plug is provided in the first region so that so that the gas can be filled or the first interlayer dielectric film can be provided between the first connection plug and the first support plug. Further, the first plug extends from the interconnection layer to the foundation, and has a second Young's modulus.

23 Claims, 10 Drawing Sheets

SEMICONDUCTOR DEVICE HAVING MULTI-LAYER INTERCONNECTION STRUCTURE AND METHOD OF MANUFACTURING THE SAME

CROSS-REFERENCE TO RELATED APPLICATIONS

This application is based upon and claims the benefit of priority from the prior Japanese Patent Application No. 2003-123737, filed Apr. 28, 2003, the entire contents of which are incorporated herein by reference.

BACKGROUND OF THE INVENTION

1. Field of the Invention

The present invention relates to a semiconductor device. In particular, the present invention relates to a semiconductor device, that has multi-layer interconnection structure, and includes a region between interconnects filled with low strength materials.

2. Description of the Related Art

Figure 23:
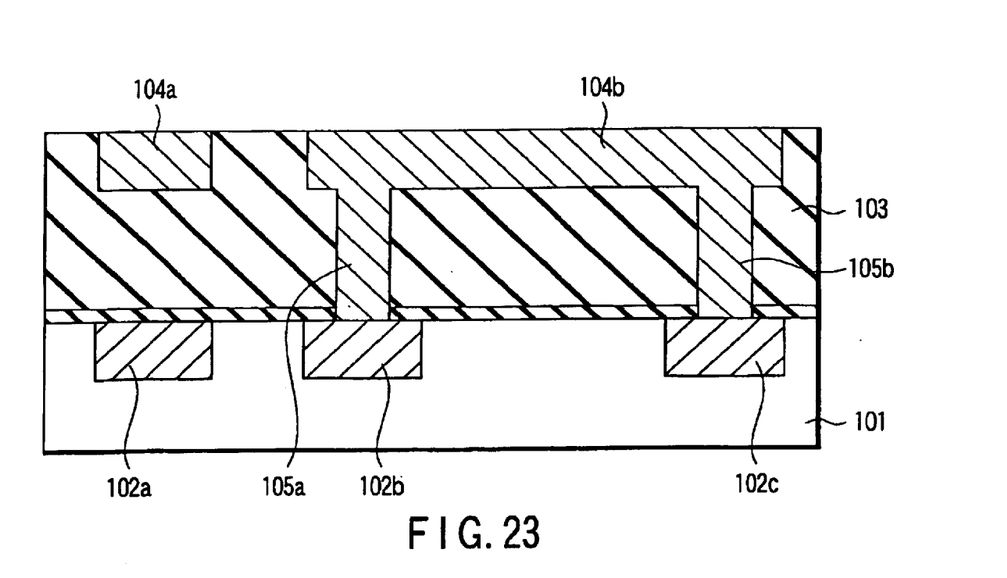
FIG. 23 is a cross-section view schematically showing a conventional structure of a semiconductor device having multi-layer interconnection structure.

In recent years, the multi-layer interconnection structure is employed to meet the needs of micro-fabrication and high integration in semiconductor devices. FIG. 23 is a cross-sectional view schematically showing a semiconductor device having the conventional multi-layer interconnection structure. As shown in FIG. 23, the surface of a semiconductor substrate 101 is formed with interconnection layers 102a to 102c. The surface of an interlayer dielectric film 103 is provided with interconnection layers 104a and 104b. The interconnection layers 104a and 104b are connected with interconnection layers 102b and 102c via connection plugs 105a and 105b, respectively.

Dielectric and conductive films constituting the semiconductor device form parasitic resistance and capacitance. Parasitic resistance and capacitance are factors generating RC delay. In order to reduce the RC delay, using interlayer dielectric films made of low dielectric constant material having a dielectric constant of about 2.5 or less has been studied. For example, porous SiOC (silicon oxide film containing carbon) is used as the low dielectric constant material.

In order to reduce the capacitance between interconnection layers, the study of a so-called air-gap interconnection structure has been conducted. In the air-gap interconnection structure, the region equivalent to the interlayer dielectric film is a vacuum or in a state enclosing gases. The air-gap interconnection structure is employed to reduce the dielectric constant of the region between interconnection layers.

The low dielectric constant material has a low strength, generally. For this reason, the following problems arise when the low dielectric constant material is used as the interlayer dielectric film.

Figure 24:
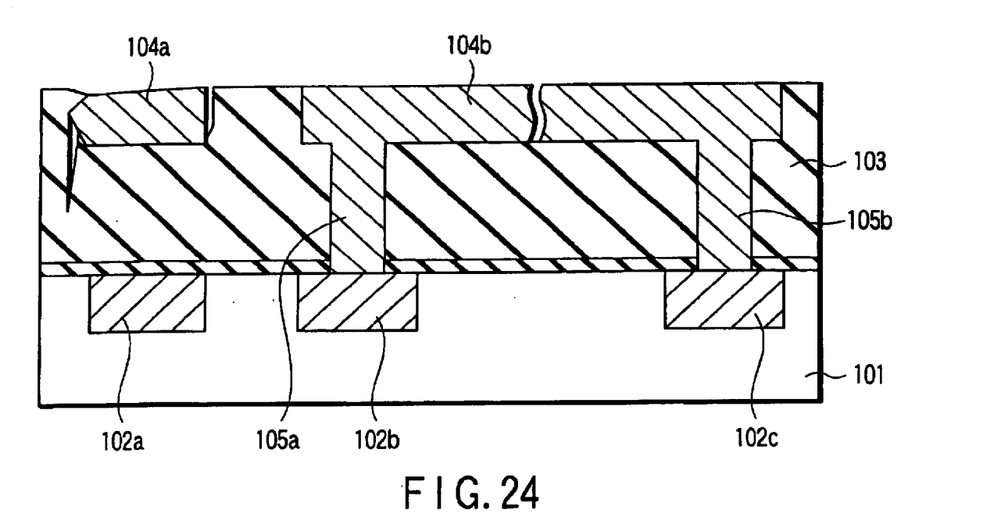
FIG. 24 is a view to explain the problem in the structure shown in FIG. 23.

When planarizing the surface using CMP (Chemical Mechanical Polish), the interlayer dielectric film 103 has a portion which is not durable to pressure applied from top. For this reason, as seen from FIG. 24, cracks occur in the interlayer dielectric film 103, particularly around the interconnection layer 104a not formed with a connection plug thereunder. In addition, the multi-layer interconnection structure is stacked higher, and thus, the lower layer, that is, the interlayer dielectric film 103 near to the semiconductor substrate 101 is not durable to the load from above. In this case, cracks occur in the lower interlayer dielectric film 103, likewise.

Each component of the semiconductor device is cooled after heat treatment during the manufacturing process, and thus, stresses of different directions and forces occur, depending upon material. Conventionally, the stress applied to the interconnection layer 104b has been offset by stress generated by the interlayer dielectric film 103. However, if a low strength material is used as the interlayer dielectric film 103, a sufficient stress cannot be applied to the interconnection layer 104b. For this reason, there is a possibility that the interconnection layer 104b is severed.

If the air-gap interconnection structure is employed, the strength of the region equivalent to the interlayer dielectric film 103 is lower than a low-strength interlayer dielectric film 103. For this reason, the use of the low-strength interlayer dielectric film 103 is particularly problematic.

BRIEF SUMMARY OF THE INVENTION

According to a first aspect of the present invention, there is provided a semiconductor device comprising: a foundation having a first conductive region; an interconnection layer provided separate from the foundation; a first region occupying a range from the foundation to the interconnection layer, and filled with gas or provided with a first interlayer dielectric film; a conductive first connection plug provided in the first region, and electrically connecting the first conductive region and the interconnection layer; and a dielectric first support plug provided in the first region, the gas being filled or the first interlayer dielectric film being provided between the first connection plug and the first support plug, the first support plug extending from the interconnection layer to the foundation and having a second Young's modulus.

According to a second aspect of the present invention, there is provided a semiconductor device comprising: a foundation having a first conductive region; a first interlayer dielectric film provided on the foundation, having a first through hole ranging from its upper surface to the foundation and a second through hole ranging from its upper surface to the first conductive region, and having a first Young's modulus; a dielectric first support plug provided in the first through hole, and having a second Young's modulus higher than the first Young's modulus; a conductive first connection plug provided in the second through hole; and an interconnection layer provided on the first interlayer dielectric film, extending from the first connection plug to the first support plug, and electrically connected with the first conductive region via the first connection plug.

According to a third aspect of the present invention, there is provided a method of manufacturing a semiconductor device, comprising: forming a foundation having a first conductive region; depositing a first interlayer dielectric film having a first Young's modulus on the foundation; forming a first through hole in the interlayer dielectric film, the first through hole ranging from an upper surface of the interlayer dielectric film to the foundation; forming a first insulating film having a second Young's modulus higher than the first Young's modulus on the interlayer dielectric film, the first insulating film buried in the first through hole; forming a second through hole in the interlayer dielectric film, the second through hole ranging from the upper surface of the interlayer dielectric film to the first conductive region; forming an interconnection trench on the surface of the interlayer dielectric film so that the bottom portion of the interconnection trench is connected with the second through hole and the interconnection trench extends on the first insulating film in the first through hole; and filling the second through hole and the interconnection trench with a first conductive film.

According to a fourth aspect of the present invention, there is provided a method of manufacturing a semiconductor device, comprising: forming a foundation having a first conductive region; forming a pillar support plug having a second Young's modulus on the foundation; forming an interlayer dielectric film having a first Young's modulus on the foundation to cover the support plug, the second Young's modulus being higher than the first Young's modulus; forming a connection plug reaching the first conductive region in the interlayer dielectric film; and forming an interconnection layer in a surface of the interlayer dielectric film, the interconnection layer extends on the support plug and the connection plug.

DETAILED DESCRIPTION OF THE INVENTION

Embodiments of the present invention will be described below with reference to the accompanying drawings. In the following description, the same reference numerals are used to designate components having substantially the identical function and configuration.

(First Embodiment)

Figure 1:
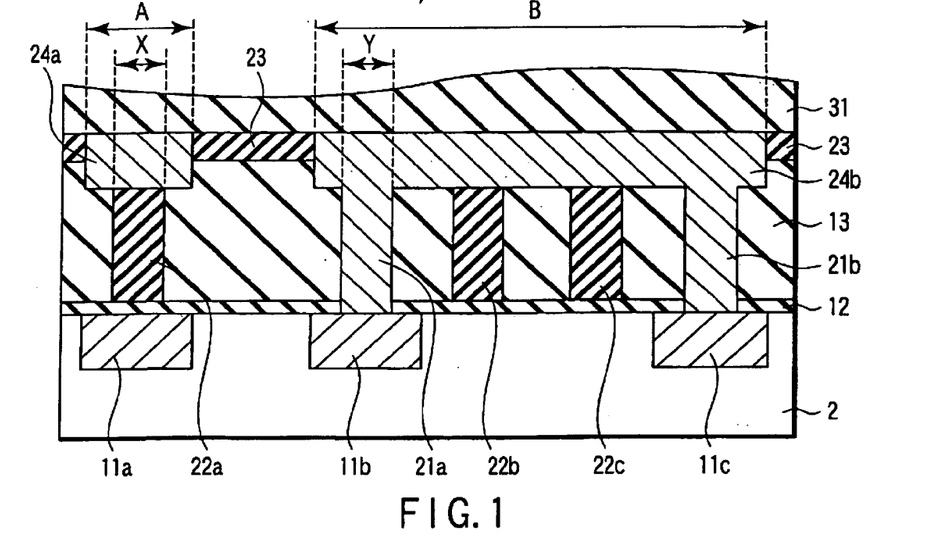
FIG. 1 is a cross-sectional view schematically showing a semiconductor device according to a first embodiment of the present invention.

FIG. 1 is a cross-sectional view schematically showing a semiconductor device according to a first embodiment of the present invention. As shown in FIG. 1, a semiconductor device 1 has multi-layer interconnection structure.

The semiconductor device 1 has a semiconductor substrate (foundation) 2. For example, silicon (Si) used as the material for the semiconductor substrate 2. The surface of the semiconductor substrate 2 is provided with first interconnection layers 11a, 11b (first conductive region) and 11c (second conductive region) having a damascene structure. The interconnection layers 11a to 11c (hereinafter, collectively called interconnection layer 11, unless special reference is made) consist of aluminum (Al), copper (Cu) and the like, for example. The use of copper serves to reduce the resistance of the interconnection layer 11. In addition, a structure may be employed such that barrier metals (not shown) are provided around the interconnection layer 11.

A stopper layer 12 is provided on the entire surface on the semiconductor substrate 2 including the surface of the interconnection layer 11. For example, silicon nitride ($Si_3N_4$, SiN) is used as the material for the stopper layer 12. The stopper layer 12 has functions of preventing a diffusion of a metal component from the interconnection layer 11 and over etching. In order to secure the functions described above, the stopper layer 12 has a film thickness of about 500 Å.

A first interlayer dielectric film 13 is provided at a region (first region) above the semiconductor substrate 2 (on the stopper layer 12). For example, a low dielectric constant material having dielectric constant of about 2.6 or less is used as the interlayer dielectric film 13. More specifically, porous SiOC, organic film and porous organic film are used.

The interlayer dielectric film 13 is provided with a pillar connection plug (via) 21a and a connection plug 21b. The connection plugs 21a and 21b (hereinafter, collectively called connection plug 21, unless special reference is made) reach the stopper layer 12. In addition, the interlayer dielectric film 13 is provided with support plugs 22a to 22c. The support plugs 22 substantially consist of a substance harder than the interlayer dielectric film 13. The support plugs 22a to 22c (hereinafter, collectively called support plug 22 unless, special reference is made) have a pillar shape similar to the connection plug 22, and are provided along the height direction of the interlayer dielectric film 13. The support plug 22 will be described later.

The entire surface on the interlayer dielectric film 13 is provided with a support layer 23. The support layer 23 consists of substantially the same material as the support plug 22. The support layer 23 has a function of softening pressure applied in a CMP process and the load applied from upward layers including a second interlayer dielectric film 31. In addition, the support layer 23 has a function of reinforcing the strength of the interlayer dielectric film 13, as described later. In order to secure the functions described above, the support layer 23 has a thickness ranging from 5 to 300 nm, preferably, 30 to 150 nm.

Second interconnection layers 24a and 24b (hereinafter, collectively called interconnection layer 24, unless special reference is made) are provided at portions ranging from the surface of the support layer 23 to part of the upper portion of the interlayer dielectric film 13. The upper surface of the interconnection layer 24 has substantially the same height as that of the support layer 23. The interconnection layer 24a extends in a direction vertical to the drawing. The interconnection layer 24b is electrically connected with first interconnection layers 11b and 11c via connection plugs 21a and 21b. The second interconnection layer 24 and the connection plug 21 consist of the same material as the first interconnection layer 11. The interconnection layer 24 may be provided with a barrier metal (not shown).

The second interlayer dielectric film 31 is provided on the support layer 23 and the inter-connection layer 24a, if desired. In FIG. 1, although not illustrated for simplification of explanation, the interlayer dielectric film 31 may be further provided with interconnection layers. Further, interlayer dielectric film and interconnection layers may be provided on the interlayer dielectric film 31. Furthermore, the same structure as the first interlayer dielectric film 13 and the support plug 22 may be arbitrarily employed as the structure above the second interlayer dielectric film 31. In this case, the semiconductor substrate 2 of FIG. 1 corresponds to the second interlayer dielectric film 31, and other portions have the same structure as shown in FIG. 1. The second interlayer dielectric film 31 will be applied to embodiments after the second embodiment.

The following is a description on the support plug 22. The support plug 22 softens the pressure applied to the interlayer dielectric film 13. Thus, the support plug 22 has a function of preventing cracks and breakages from occurring in the interlayer dielectric film 13. In addition, the support plug 22 has a function of preventing interconnection layers from being broken down along the extending direction after thermal process. This results from the difference in stress between the interlayer dielectric film 13 and the interconnection layer 24.

The structural conditions of the support plug 22 are determined taking structure, arrangement, strength and material of the interlayer dielectric film 13 into consideration, as shown below. In addition, the support plug 22 has an area and arrangement interval such that the load applied to the interlayer dielectric film 13 is softened and the interconnection layer 24 is not broken down.

The following condition is given as one of the structural conditions of the support plug 22. For example, the support plug 22 consists of substance harder than the interlayer dielectric film 13. The support plug 22 has Young's modulus larger than the interlayer dielectric film 13 as one condition of the substance harder than the same. More specifically, the Young's modulus is set to two times or more as much as the interlayer dielectric film 13. Silicon oxide film ($SiO_2$, SiO), SiN, silicon carbide film (SiC), and SiOC are used as materials having Young's modulus described above.

The following condition is given as another of the structural conditions of the support plug 22. The width (direction crossing the extending direction of interconnection layer) X of the support plug 22 is 1 to 100%, preferably 10 to 50%, more preferably 10 to 30% of the width (same as above) A of the interconnection layer 24.

The following condition is given as another of the structural conditions of the support plug 22. The support plug 22 is provided at the region provided with no connection plug 21 in the interlayer dielectric film 13. In addition, several support plugs 22 are provided along the interconnection layer 24 (two support plugs are shown in FIG. 1). The interval between support plugs 22 is determined in accordance with the extending-direction length Y of the interconnection layer 24 and the length B thereof. To give an example, the support plug 22 is provided every distance of 0.05 to 50% of the length Y, preferably 1 to 50%, more preferably 10 to 30%.

The following condition is given as another of the structural conditions of the support plug 22. The cross sectional area of the support plug 22 and the interval between support plugs 22 may be determined so that the support plug 22 is provided in the following manner. The support plug 22 is provided at the region of 1 to 80% of the area of the region provided with no connection plug 21 in the area of the base of the interconnection layer 24, preferably 5 to 30%, more preferably 10 to 20%.

As described above, the support plug 22 consists of the substance harder than the interlayer dielectric film 13. Generally, when the hardness of the substance is high, the dielectric constant increases. For this reason, if the support plug 22 covers too much area, the dielectric constant of the region between interconnection layers 11 and 24 increases as a whole. Therefore, the structure of the support plug 22 is determined so that a desired dielectric constant can be obtained in the region while the pressure applied to the interlayer dielectric film 13 can be sufficiently softened.

The method of manufacturing the semiconductor device 1 having the foregoing structure will be descried with reference to FIG. 1 to FIG. 7.

Figure 2:
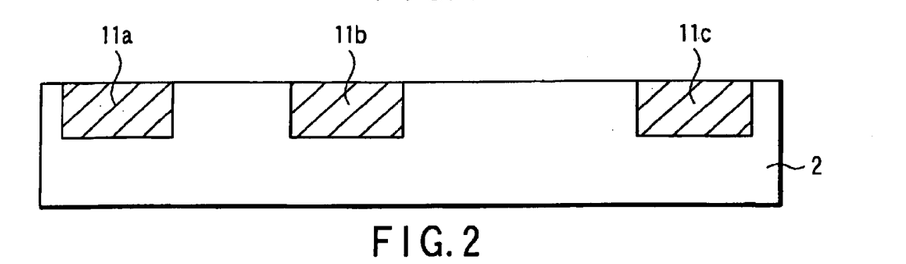
FIGS. 2, 3, 4, 5, 6, 7 are cross-sectional views schematically showing the process of manufacturing the semiconductor device shown in FIG. 1.

As shown in FIG. 2, the surface of the semiconductor substrate 2 is formed with interconnection trenches for first interconnection layers 11a to 11c using etching techniques such as lithography and RIE (Reactive Ion Etching). A material film for interconnection layers 11a to 11c is deposited on the entire surface of the semiconductor substrate 2, and thus, the interconnection trench is filled with the material film. Then, extra material film on the semiconductor substrate 2 is removed using CMP. As a result, interconnection layers 11a to 11c are formed.

Figure 3:
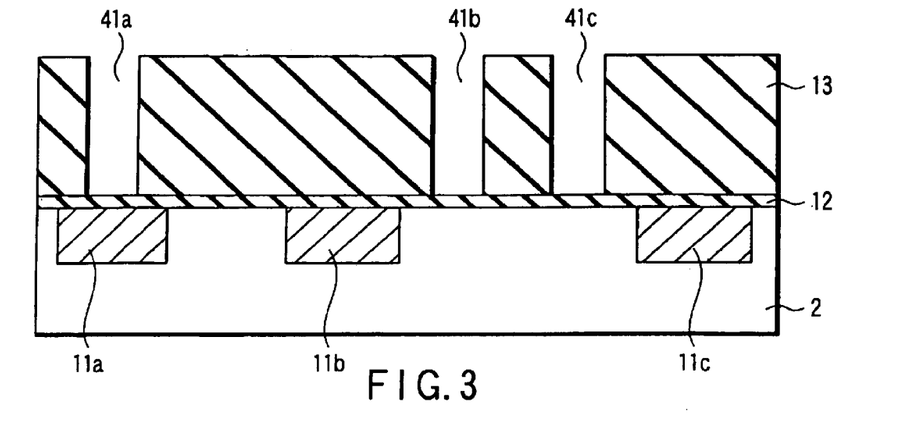

As illustrated in FIG. 3, the stopper layer 12 is formed on the entire surface of the semiconductor substrate 2 including the upper surface of the interconnection layer 11 using the following process. The process includes CVD (Chemical Vapor Deposition), sputtering and coating (hereinafter, referred to simply as a known process). The interlayer dielectric film 13 is formed on the stopper layer 12 using a known process. Via holes (first through hole) 41a to 41c are formed in the interlayer dielectric film 13 corresponding to regions where support plugs 22a to 22c will be formed, using lithography and etching techniques.

Figure 4:
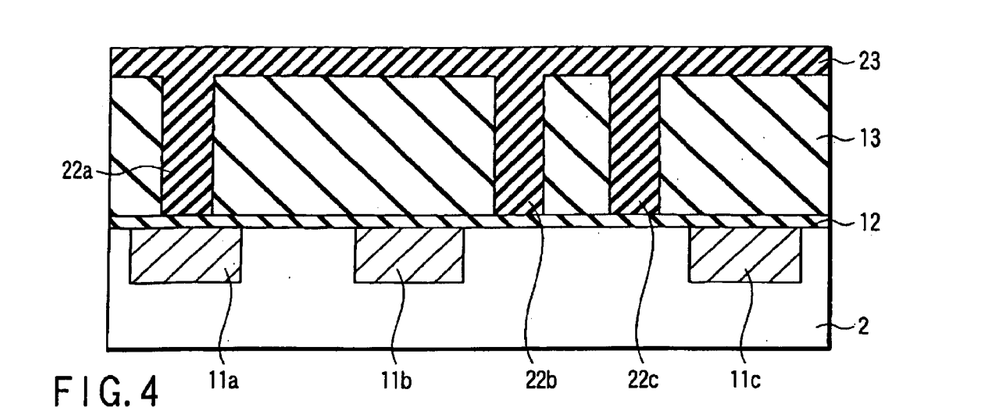

As seen from FIG. 4, support plugs 22a to 22c and a material film for the support layer 23 are deposited on the entire surface of the semiconductor substrate 2 by a known process. The via holes (first through hole) 41a to 41c are filled with the material film, and thus, support plugs 22a to 22c and the support layer 23 are formed.

Figure 5:
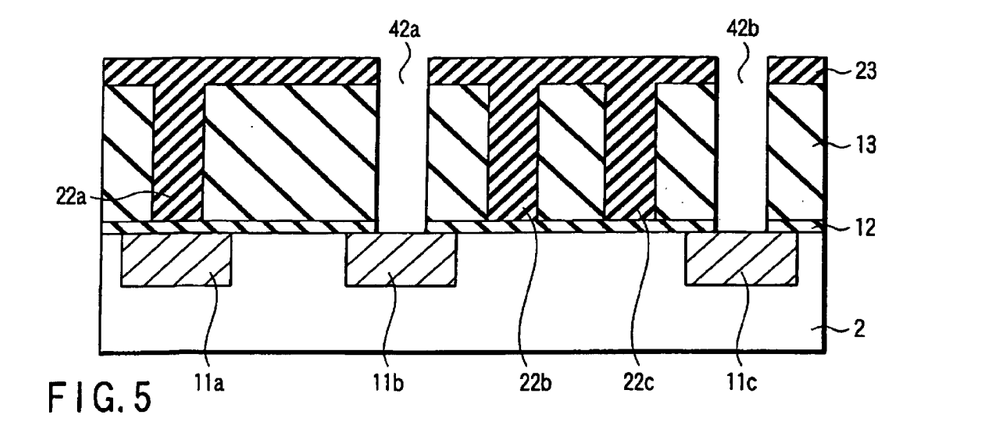

As depicted in FIG. 5, via holes 42a and 42b are formed in the interlayer dielectric film 13 corresponding to regions where connection plugs 21a and 21b will be formed, using lithography and etching techniques.

Figure 6:
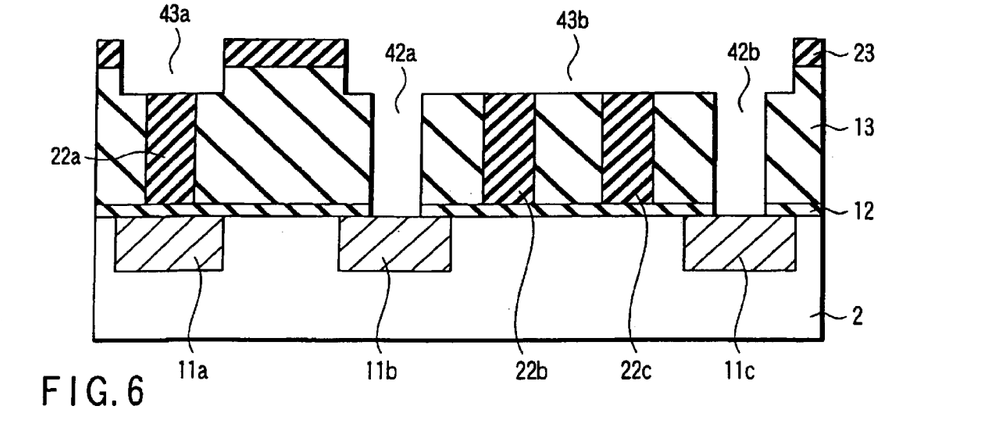

As shown in FIG. 6, trenches 43a and 43b for second interconnection layers 24a and 24b are formed using lithography and etching techniques.

Figure 7:
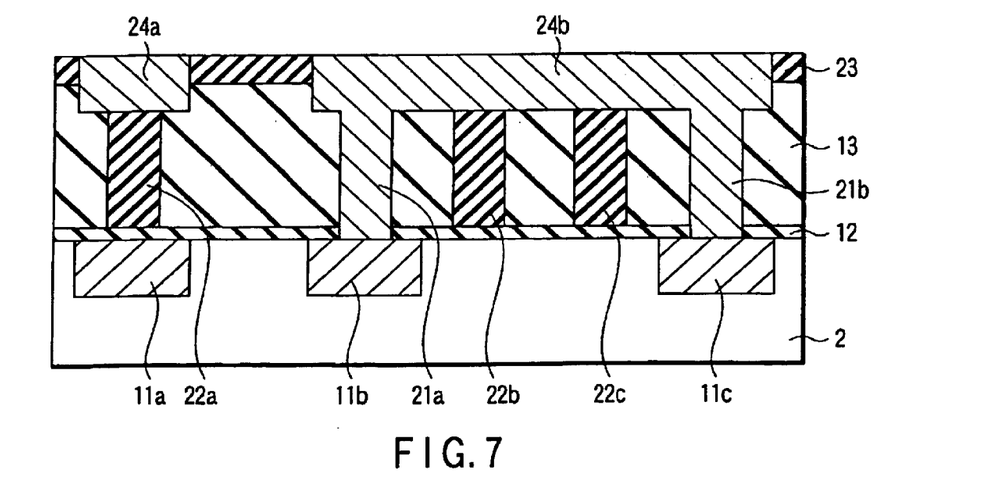

As illustrated in FIG. 7, a material film for the interconnection layer 24 and the connection plug 21 is deposited on the entire surface of the semiconductor substrate 2 by CVD. As a result, via holes 42a, 42b and interconnection trenches 43a, 43b are filled with the material film. Then, extra material film on the support layer 23 is removed by CMP, and thus, interconnects 24a, 24b and connection plugs 21a, 21b are formed.

As seen from FIG. 1, the interlayer dielectric film 31 is formed, and thereafter, interconnection layers and connection plugs may be further formed, if desired.

According to the first embodiment of the present invention, in the interlayer dielectric film 13, support plugs 22a to 22c are provided at the portion provided with no connection plugs 21a and 21b under interconnection layers 24a and 24b. The support plug 22 consists of the material having strength higher than the interlayer dielectric film 13. Thus, the support plug 22 serves to soften the pressure in CMP process or the load applied to the interlayer dielectric film 13 from upper layers. Therefore, the interconnection layer 24, that is, the portion provided with no connection plug 21 can be prevented from caving in or sinking in toward the interlayer dielectric film 13. As a result, it is possible to prevent crack from occurring in the foregoing portion of the interlayer dielectric film 13.

In addition, the support layer 23 is provided on the interlayer dielectric film 13 between second interconnection layers 24a and 24b. Thus, pressure and load applied from the top are widely dispersed by the support layer 23. Therefore, the interconnection layer 24 can be prevented from caving, sinking and breakage in associated with the effect obtained by the support plug 22.

The support plug 22 serves to soften the stress generated in the extending direction in the interconnection layer 24. Therefore, it is possible to prevent the interconnection layer 24 from breakage in cooling after heat treatment. The support layer 23 is provided, and thus, the stress in cooling is further softened, so that the interconnection layer 24 can be prevented from breakage.

(Second Embodiment)

Figure 8:
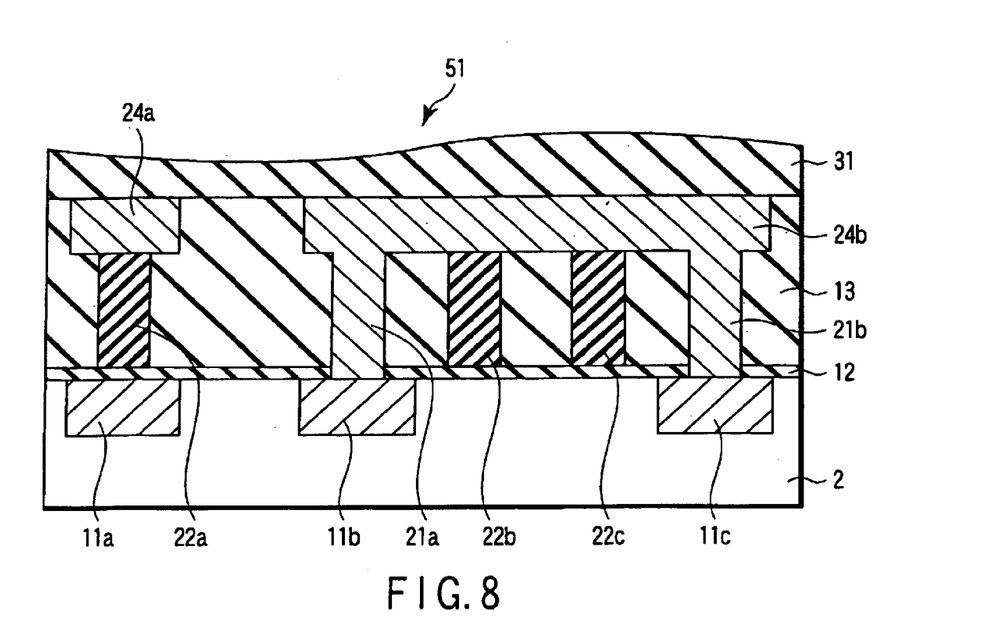
FIG. 8 is a cross-sectional view schematically showing a semiconductor device according to a second embodiment of the present invention.

A semiconductor device according to a second embodiment has the structure removing the support layer 23 from the semiconductor device of the first embodiment.

FIG. 8 is a cross-sectional view schematically showing a semiconductor device 51 according to the second embodiment of the present invention. As seen from FIG. 8, the interlayer dielectric film 31 is provided on the interlayer dielectric film 31 without interposing the support layer 23.

The method of manufacturing the semiconductor device 51 having the foregoing structure will be described with reference to FIG. 8 to FIG. 11. The same process is carried out until FIG. 4 of the first embodiment. As a result, the support plug 22 is formed in the interlayer dielectric film 31, and the support layer 23 is deposited on the interlayer dielectric film 13.

Figure 9:
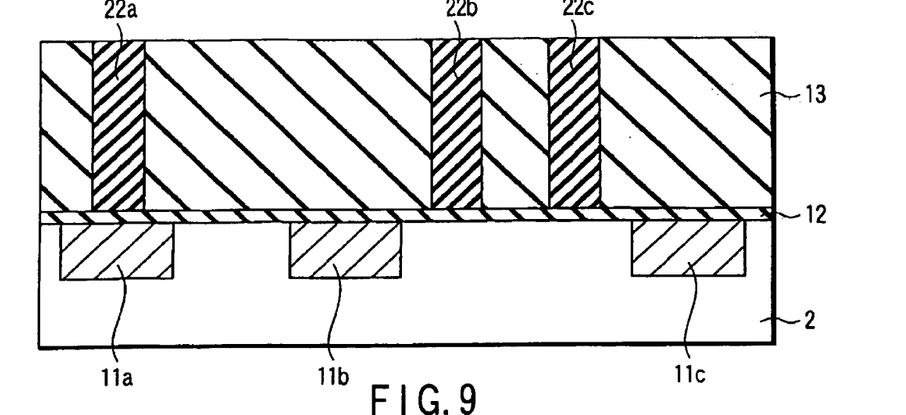
FIGS. 9, 10, 11 are cross-sectional views schematically showing the process of manufacturing the semiconductor device shown in FIG. 8.

As shown in FIG. 9, the support layer 23 is removed by CMP. In this case, the support plug 22 softens the pressure applied to the interlayer dielectric film 13; therefore, crack can be prevent from occurring in the interlayer dielectric film 13.

Figure 10:
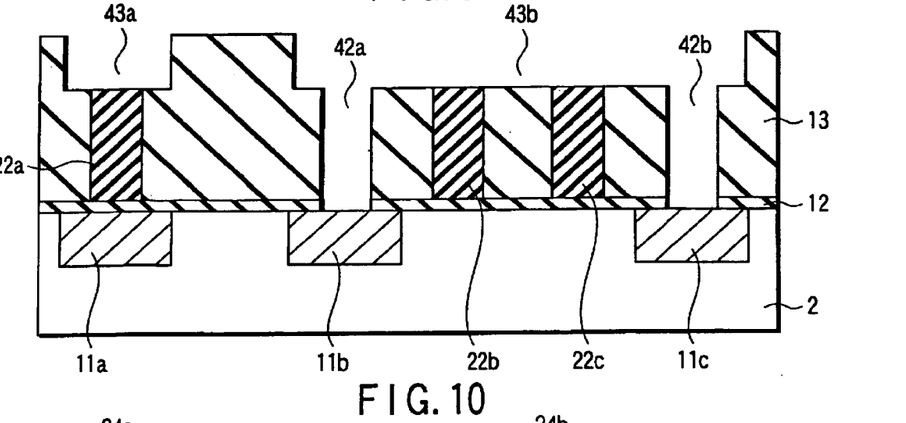

As illustrated in FIG. 10, via holes 42a, 42b and interconnection trenches 43a, 43b are formed via the same process as FIG. 5 of the first embodiment.

Figure 11:
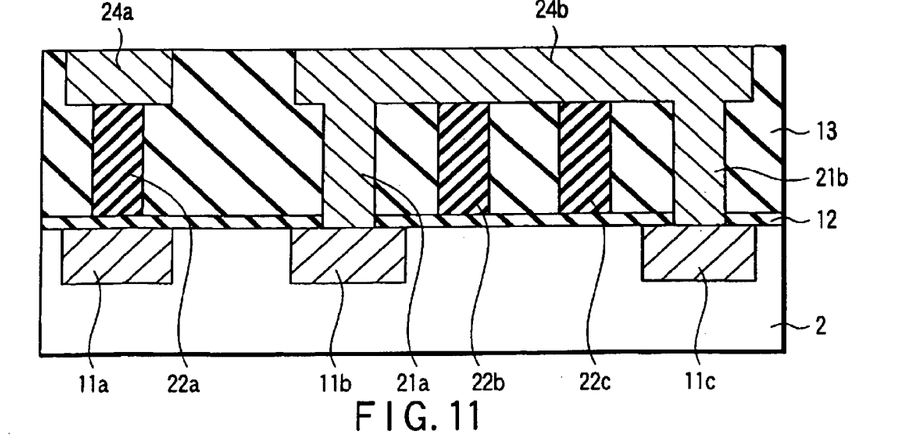

As depicted in FIG. 11, connection plugs 21a, 21b and interconnection layers 24a, 24b are formed via the same process as FIG. 7 of the first embodiment.

As seen from FIG. 8, the interlayer dielectric film 31 is formed via the same process as FIG. 1 of the first embodiment.

In the semiconductor device according to the second embodiment, support plugs 22a to 22c are provided in the interlayer dielectric film 31 under interconnection layers 24a and 24b, like the first embodiment. Thus, the same effect as the first embodiment can be obtained.

The semiconductor device according to the second embodiment has no support layer 23, unlike the first embodiment. For this reason, there is no effect obtained by the support layer 23 described in the first embodiment. However, with no support layer 23, which typically has a dielectric constant higher than the interlayer dielectric film 13, parasitic capacitance can be reduced in the entirety of the semiconductor device 51.

(Third Embodiment)

The third embodiment relates to a modification example of the second embodiment. The structure is the same as the second embodiment (FIG. 8), and the manufacturing method is different from the second embodiment. The method of manufacturing a semiconductor device according to the third embodiment will be described below with reference to FIG. 2, FIG. 3, FIG. 8 and FIG. 10 to FIG. 14.

Figure 12:
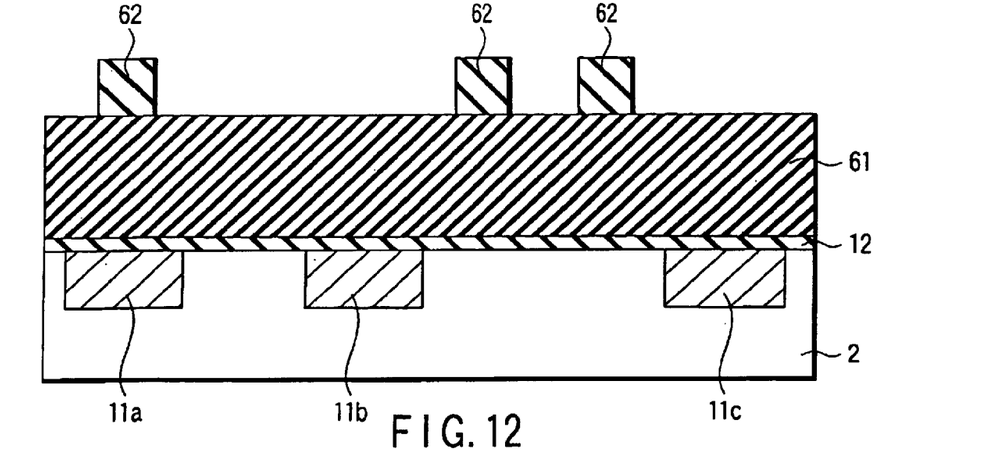
FIGS. 12, 13, 14 are cross-sectional views schematically showing the process of manufacturing a semiconductor device according to a third embodiment of the present invention.

The same process as FIG. 2 of the first embodiment is carried out, and thus, interconnection layers 11a to 11c are formed in the semiconductor substrate 2. As shown in FIG. 12, a material film 61 for the support plug 22 is deposited on the entire surface of the semiconductor substrate 2 by a known process. A mask material 62 is deposited on the material film 61. The mask material 62 is patterned to cover regions where support plugs 22a to 22c will be formed, using lithography and etching technique such as RIE.

Figure 13:
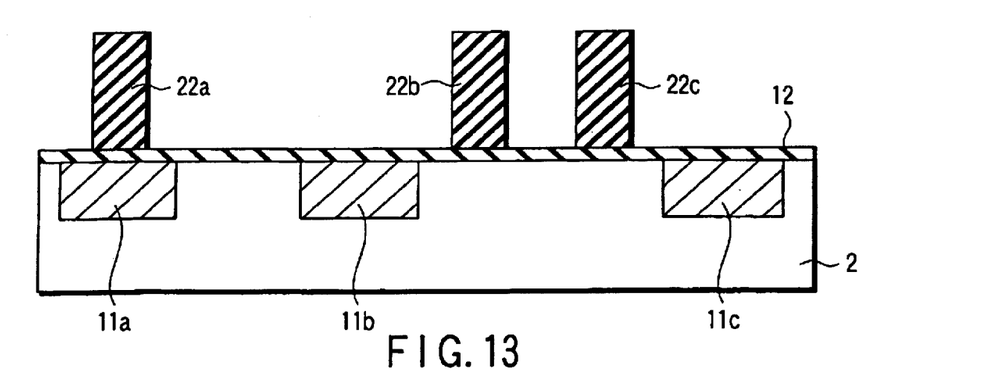

As illustrated in FIG. 13, the material film 61 is patterned by etching technique such as RIE using the mask material 62 as a mask. As a result, support plugs 22a to 22c are formed.

Figure 14:
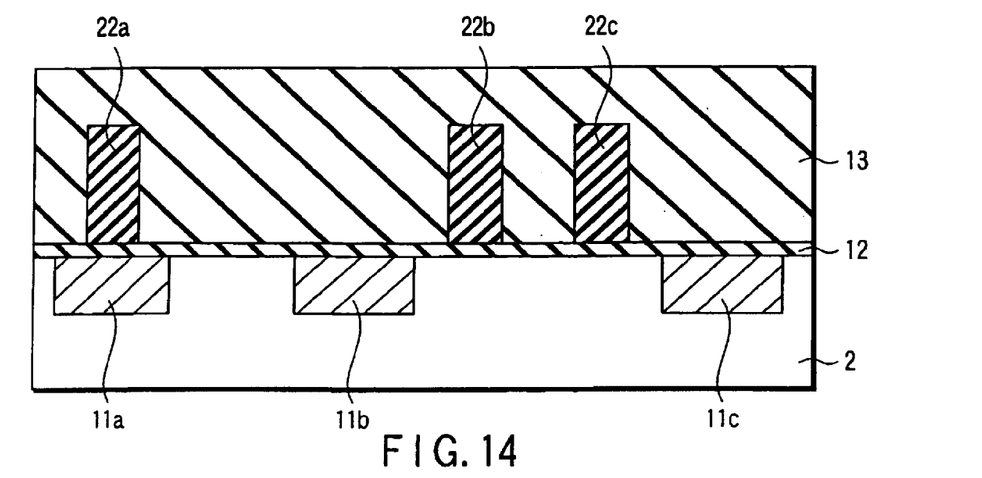
Figure 15:
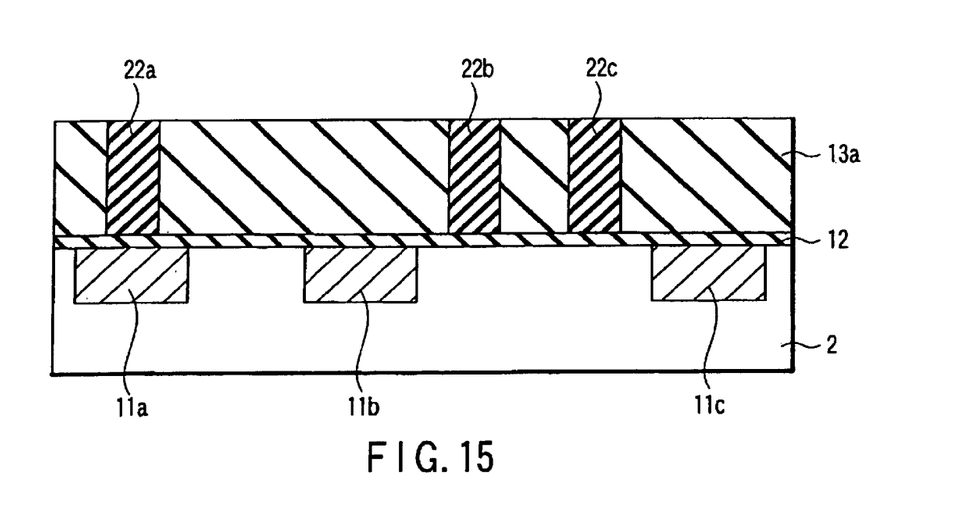
FIG. 15 and FIG. 16 are cross-sectional views schematically showing the process of manufacturing a semiconductor device according to a fourth embodiment of the present invention.

As depicted in FIG. 14, the same process as FIG. 3 of the first embodiment is carried out, and thus, the interlayer dielectric film 13 is deposited on the entire surface of the semiconductor substrate 2. The process after that is the same as shown in FIG. 10 and FIG. 11 of the second embodiment.

In the semiconductor device according to the third embodiment, support plugs 22a to 22c are provided in the interlayer dielectric film 13 under interconnection layers 24a and 24b, like the second embodiment. Thus, the same effect as the first embodiment can be obtained. In addition, the semiconductor device according to the third embodiment has no support layer 23; therefore, the same effect as the second embodiment can be obtained.

According to the method of manufacturing the semiconductor device of the third embodiment, the same structure as the semiconductor device according to the second embodiment can be obtained.

(Fourth Embodiment)

The fourth embodiment relates to a modification example of the second embodiment. The structure is the same as the second embodiment (FIG. 8), and the manufacturing method is different from the second embodiment. The method of manufacturing a semiconductor device according to the fourth embodiment will be described below with reference to FIG. 8, FIG. 9, and FIG. 13 to FIG. 16.

The same process is carried out until FIG. 9 of the second embodiment. As a result, interconnection layers 11a to 11c, stopper layer 12, the same interlayer dielectric film 13a as the interlayer dielectric film 13 and support plugs 22a to 22b are formed.

Figure 16:
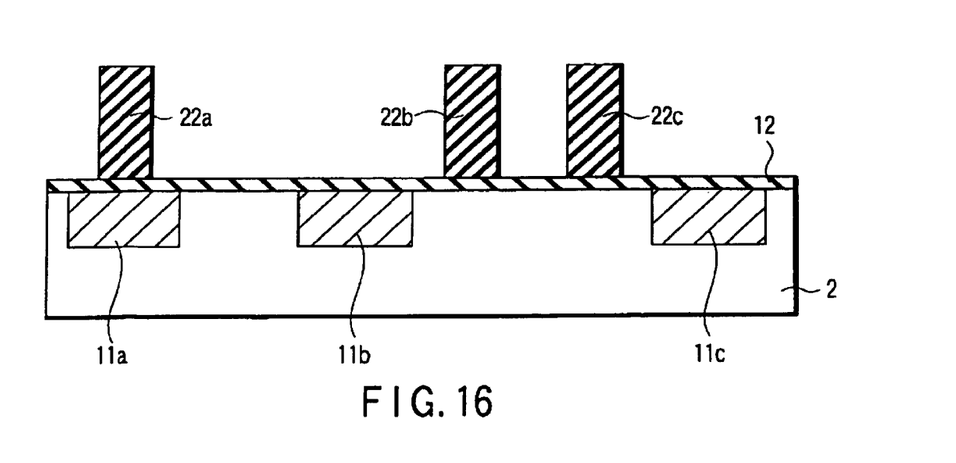

As shown in FIG. 16, the interlayer dielectric film 13a is removed by wet etching using hydrofluoric acid, for example. As a result, the same structure as shown in FIG. 13 of the third embodiment is obtained. The process after that is the same as FIG. 14 of the third embodiment.

In the semiconductor device according to the fourth embodiment, support plugs 22a to 22c are provided in the interlayer dielectric film 13 under interconnection layers 24a and 24b, like the first embodiment. Thus, the same effect as the first embodiment can be obtained. In addition, the semiconductor device according to the fourth embodiment has no support layer 23; therefore, the same effect as the second embodiment can be obtained.

According to the method of manufacturing the semiconductor device of the fourth embodiment, the same structure as the semiconductor device according to the second embodiment can be obtained.

(Fifth Embodiment)

Figure 17:
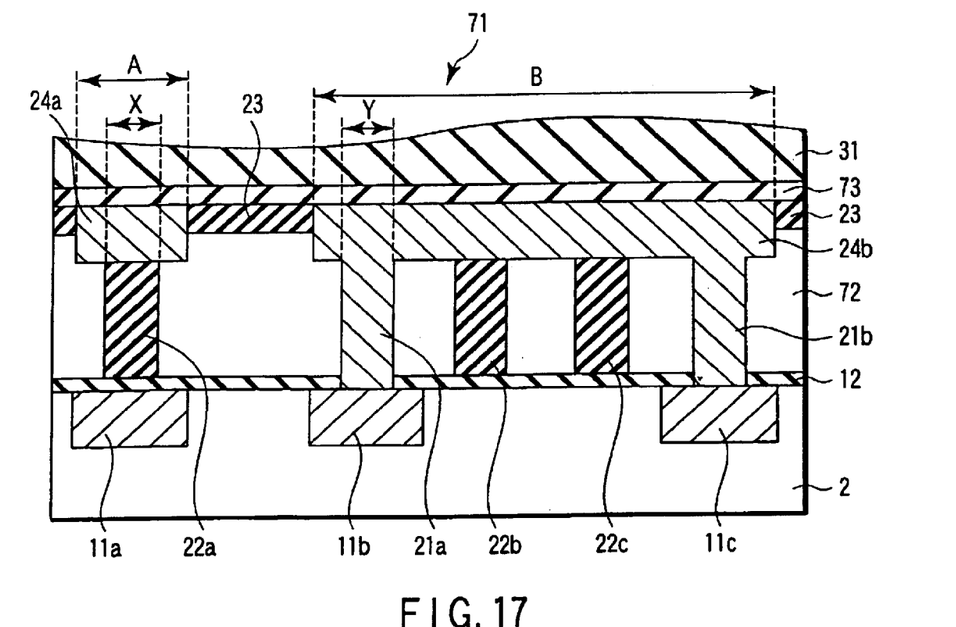
FIGS. 17, 18, 19 are cross-sectional views schematically showing the process of manufacturing a semiconductor device according to a fifth embodiment of the present invention.

The fifth embodiment relates to a semiconductor device having air-gap interconnection structure. FIG. 17 is a cross-sectional views view schematically showing the process of manufacturing a semiconductor device 71 according to the fifth embodiment of the present invention.

As shown in FIG. 17, gas is sealed in an interlayer region 72 (first region) by the support layer 23 above the semiconductor substrate 2 (above the stopper layer 12). Referring to that gas is sealed also means a vacuum state. The vacuum state means a pressure state lower than the atmosphere (typically, 1 atmosphere). For example, $N_2$, He and Ar are used as the gas sealed in the interlayer region 72. Gas filling the interlayer region 72 exists between connection plugs 21a and 21b and between support plugs 22a to 22c. Therefore, a predetermined interval is formed between connection plugs 21a and 21b and between support plugs 22a to 22c.

A stopper layer 73 is provided over the entire surface of the support layer 23 and the interconnection layer 24. The stopper layer 73 has the same structure as the stopper layer 12. The interlayer dielectric film 31 is provided on the entire surface of the stopper layer 73.

In the air-gap interconnection structure, the strength of the interlayer region 72 is lower than the case where interlayer dielectric film is provided. For this reason, the structure and arrangement of the support plug 22 are determined so that the region occupied by the support plug 22 becomes larger than the first to fourth embodiment providing the interlayer dielectric film.

For example, Young's modulus of the support plug 22 is 10 or more, preferably 50 to 200, more preferably 80 to 200.

The width X of the support plug 22 is 1 to 100% of the width A of the interconnection layer 24, preferably 10 to 100%, more preferably 20 to 50%.

The support plug 22 is provided for distance of 0.05 to 80% of the length Y, preferably 1 to 80%, more preferably 20 to 50%.

The cross sectional area of the support plug 22 and the interval between support plugs 22 are determined so that the support plug 22 is provided in the following manner. The support plug 22 is provided to cover the region of 1 to 80% of the area of the region provided with no connection plug 21 in the area of the base of the interconnection layer 24, preferably 5 to 50%, more preferably 10 to 30%.

The method of manufacturing the semiconductor device 71 having the foregoing structure will be described with reference to FIG. 7 and FIG. 17 to FIG. 19. The same process is carried out until FIG. 7 of the first embodiment. By doing so, interconnection layer 11, stopper layer 12, interlayer dielectric film 13, connection plug 21, support plug 22, support layer 23 and interconnection layer 24 are formed as shown in FIG. 7.

Figure 18:
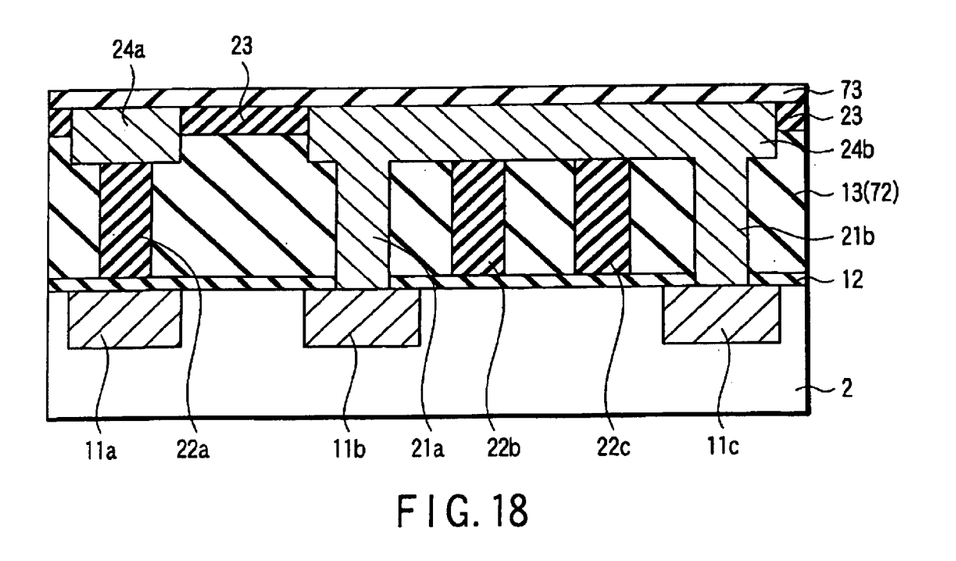

As illustrated in FIG. 18, the stopper layer 73 is deposited on the entire surface of the semiconductor substrate 2 by a known process.

Figure 19:
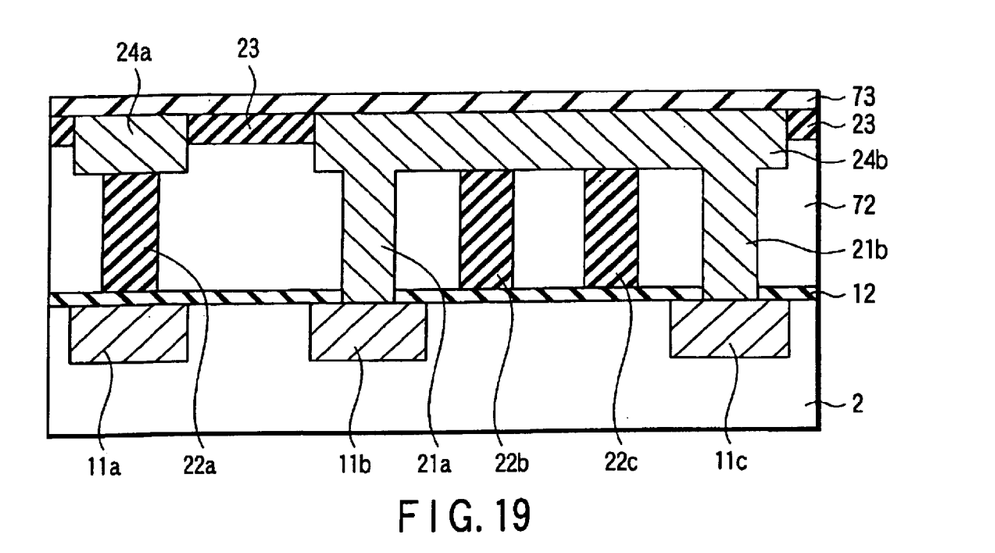

As seen from FIG. 19, the interlayer dielectric film 13 is removed. In order to removing the interlayer dielectric film 13, the following processes may be employed. For example, one is the process of forming openings in part of the stopper layer 73 and the support layer 23, and using RIE implanting ions from the openings. Another is the process of removing the interlayer dielectric film 13 by wet etching using the openings. Another is the process of implanting gas from openings after removing the interlayer dielectric film 13, and closing the openings so that the interlayer region 72 can be filled with gas.

As depicted in FIG. 17, the interlayer dielectric film 31 is formed on the stopper layer 73.

According to the fifth embodiment of the present invention, the semiconductor device 71 includes multi-layer interconnections having air-gap interconnection structure. In the interlayer region 72 filled with gas, support plugs 22a to 22c are provided at portions formed with no connection plugs 21a and 21b under interconnection layers 24a and 24b. Therefore, in the interconnection layer 24, the portion provided with no connection plug 21 can be prevented from caving in by the pressure applied to the interconnection layer 24.

The support plug 22 serves to soften the stress acting in the extending direction of the interconnection layer 24. Therefore, the interconnection layer 24 can be prevented from being breakage in cooling after heat treatment.

The support layer 23 is provided, and thus, the pressure applied to the interconnection layer 24 is widely dispersed, and the stress generated in the interconnection layer 24 is softened. Therefore, in associated with the effect obtained by the support plug 22, the interconnection layer 24 can be prevented from breakage and caving in.

(Sixth Embodiment)

Figure 20:
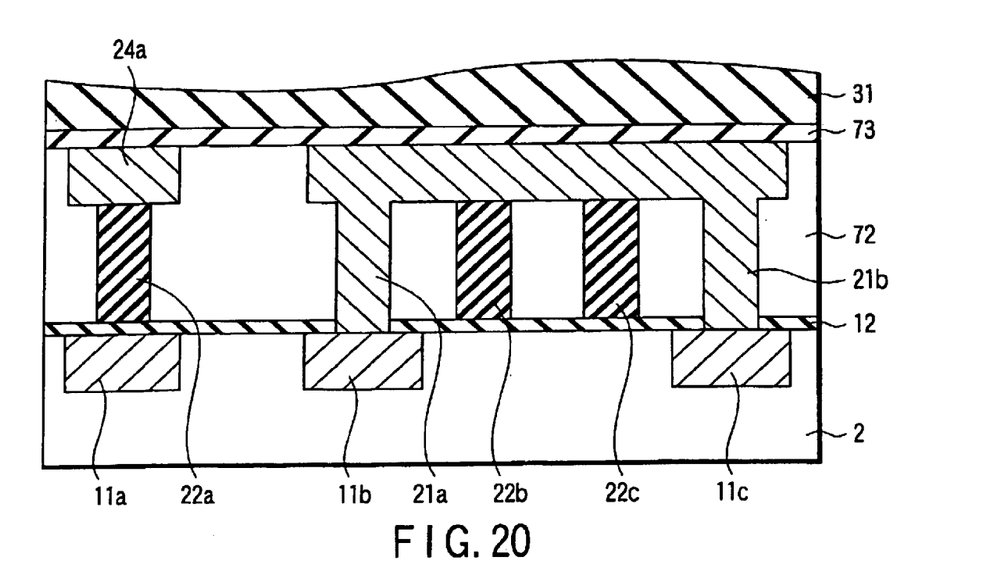
FIG. 20 is a cross-sectional view schematically showing a semiconductor device according to a sixth embodiment of the present invention.

A semiconductor device according to the sixth embodiment has the structure removing the support layer 23 from the semiconductor device according to the fifth embodiment.

FIG. 20 is a cross-sectional view schematically showing a semiconductor device 81 according to the sixth embodiment of the present invention. As shown in FIG. 20, the stopper layer 73 is provided on the second interconnection layer 24. The interlayer region 72 filled with gas occupies the range from the stopper layer 12 to the stopper layer 73. In the sixth embodiment, the support plug 22 has the same structure as the fifth embodiment.

The method of manufacturing the semiconductor device 81 having the foregoing structure will be described with reference to FIG. 10, FIG. 11, FIG. 14 and FIG. 20 to FIG. 22. The same process is carried out until FIG. 14 of the third embodiment. By doing so, interconnection layer 11, stopper layer 12, interlayer dielectric film 13, and support plug 22 are formed as shown in FIG. 14.

The same process as FIG. 10 and FIG. 11 of the second embodiment is carried out, and thus, connection plug 21 and interconnection layer 24 are formed as shown in FIG. 11.

Figure 21:
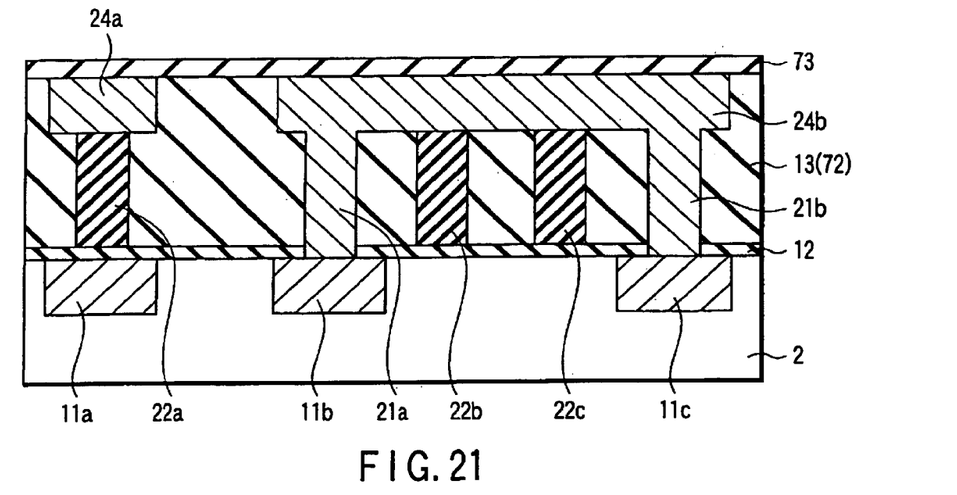
FIG. 21 and FIG. 22 are cross-sectional views schematically showing the process of manufacturing the semiconductor device shown in FIG. 20.

As illustrated in FIG. 21, the stopper layer 73 is deposited on the entire surface of the semiconductor substrate 2 by public-known process.

Figure 22:
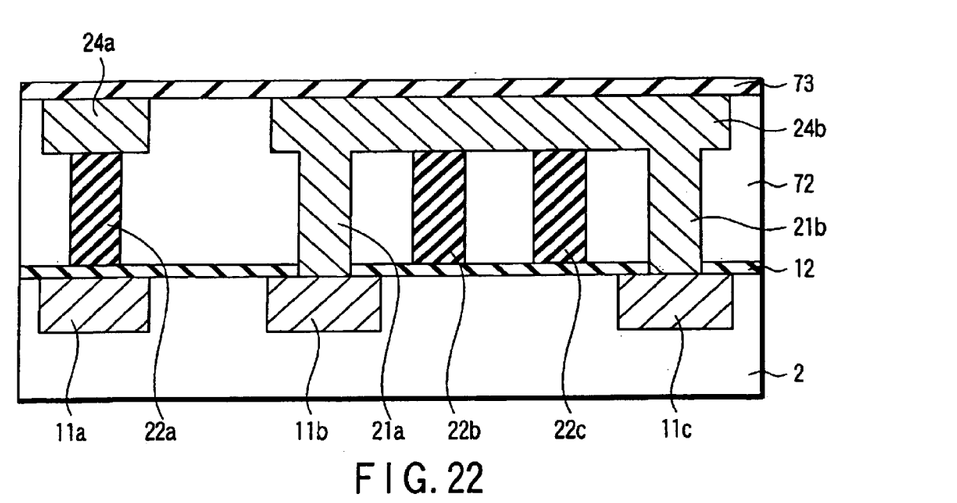

As seen from FIG. 22, the interlayer dielectric film 13 is removed via the same process as shown in FIG. 19 of the fifth embodiment, and thus, the interlayer region 72 is filled with gas. As shown in FIG. 20, the interlayer dielectric film 31 is formed by a known process.

According to the sixth embodiment of the present invention, the semiconductor device 81 includes multi-layer interconnections having air-gap interconnection structure, like the fifth embodiment. In the interlayer region 72 filled with gas, support plugs 22a to 22c are provided at portions formed with no connection plugs 21a and 21b under interconnection layers 24a and 24b. Therefore, the same effect as the fifth embodiment can be obtained.

The semiconductor device according to the sixth embodiment has the structure removing the support layer 23, unlike the fifth embodiment. For this reason, there is no effect obtained by the support layer 23 described in the fifth embodiment. However, with no support layer 23, which typically has a dielectric constant higher than the interlayer dielectric film 13, parasitic capacitance can be reduced in the entirety of the semiconductor device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
a foundation having a first conductive region;
an interconnection layer provided separate from the foundation;
a first region occupying a range from the foundation to the interconnection layer, and filled with gas or provided with a first interlayer dielectric film;
a conductive first connection plug provided in the first region, and electrically connecting the first conductive region and the interconnection layer;
a dielectric first support plug provided in the first region, the gas being filled or the first interlayer dielectric film being provided between the first connection plug and the first support plug, the first support plug extending from the interconnection layer to the foundation and having a first Young's modulus; and
a support layer provided so that its upper end is positioned at the same height as the upper end of the interconnection layer, and consisting essentially of the same material as the first support plug.

2. The device according to claim 1, wherein the first Young's modulus is 10 or more.

3. The device according to claim 1, wherein the first region is provided with the first interlayer dielectric film having a second Young's modulus, and the first Young's modulus is higher than the second Young's modulus.

4. The device according to claim 3, wherein the first Young's modulus is two times or more the second Young's modulus.

5. The device according to claim 3, wherein the first interlayer dielectric film consists essentially of a material having a dielectric constant of 2.6 or less.

6. The device according to claim 1, wherein the foundation has a second conductive region,
the device further includes a conductive second connection plug, which is provided in the first region and electrically connects the second conductive region and the interconnection layer,
the interconnection layer extends on the second connection plug, and is electrically connected with the second conductive region via the second connection plug, and
the first support plug is positioned between the first and second connection plugs along the interconnection layer.

7. The device according to claim 6, further comprising:
a dielectric second support plug provided in the first region, and extending from the interconnection layer to the foundation, and
wherein the interconnection layer extends on the second support plug,
the second support plug being positioned between the first support plug and the second connection plug along the interconnection layer.

8. The device according to claim 6, further comprising:
dielectric third to n-th support plugs provided in the first region, and extending from the interconnection layer to the foundation, and
wherein the interconnection layer extends on the third to n-th support plugs,
the total area of the first to n-th support plugs facing a surface of the interconnection layer is 1 to 80% of the area of the interconnection layer facing the foundation.

9. The device according to claim 1, wherein the first support plug consists essentially of a material selected from a group consisting of SiO, SiN, SiC and SiOC.

10. The device according to claim 1, wherein the thickness of the support layer is 5 to 300 nm.

11. The device according to claim 1, further comprising a second interlayer dielectric film provided on the interconnection layer.

12. The device according to claim 1, further comprising a dielectric second support plug contacting the foundation and the support layer under the support layer, the second support plug consisting essentially of the same material as the first support plug.

13. A semiconductor device comprising:
a foundation having a first conductive region;
a first interlayer dielectric film provided on the foundation, having a first through hole ranging from its upper surface to the foundation and a second through hole ranging from its upper surface to the first conductive region, and having a first Young's modulus;
a dielectric first support plug provided in the first through hole, and having a second Young's modulus higher than the first Young's modulus;
a conductive first connection plug provided in the second through hole;
an interconnection layer provided on the first interlayer dielectric film, extending from the first connection plug to the first support plug, and electrically connected with the first conductive region via the first connection plug; and
a support layer provided so that its upper end is positioned at the same height as the upper end of the interconnection layer, and consisting essentially of the same material as the first support plus.

14. The device according to claim 13, wherein the second Young's modulus is 10 or more.

15. The device according to claim 13, wherein the second Young's modulus is two times or more the first Young's modulus.

16. The device according to claim 13, wherein the first interlayer dielectric film consists essentially of a material having a dielectric constant of 2.6 or less.

17. The device according to claim 13, wherein the foundation has a second conductive region,
the first interlayer dielectric film has a third through hole ranging from its upper surface to the second conductive region,
a conductive second connection plug is provided in the third through hole,
the interconnection layer extends on the second connection plug, and is electrically connected with the second conductive region via the second connection plug, and the first support plug is positioned between the first and second connection plugs along the interconnection layer.

18. The device according to claim 13, wherein the first interlayer dielectric film has a fourth through hole ranging from its upper surface to the foundation,
   a dielectric second support plug having a Young's modulus higher than the first interlayer dielectric film is provided in the fourth through hole,
   the interconnection layer extends on the second support plug, and
   the second support plug is positioned between the first support plug and the second connection plug along the interconnection layer.

19. The device according to claim 18, wherein the first interlayer dielectric film has fifth to n+2-th through holes ranging from its upper surface to the foundation,
   dielectric third to n-th support plugs are provided in the fifth to n+2-th through holes having a Young's modulus higher than the first interlayer dielectric film,
   the interconnection layer extends on the third to n-th support plugs, and
   the total area of the first to n-th support plugs facing the surface of the interconnection layer is 1 to 80% of the area of the interconnection layer facing the foundation.

20. The device according to claim 13, wherein the first support plug consists essentially of a material selected from a group consisting of SiO, SiN, SiC and SiOC.

21. The device according to claim 13, wherein the thickness of the support layer is 5 to 300 nm.

22. The device according to claim 13, further comprising a second interlayer dielectric film provided on the interconnection layer.

23. The device according to claim 13, further comprising a dielectric second support plug contacting the foundation and the support layer under the support layer, the second support plug consisting essentially of the same material as the first support plug.

* * * * *